(12) United States Patent
Huang et al.

(10) Patent No.: US 11,793,057 B2
(45) Date of Patent: Oct. 17, 2023

(54) DISPLAY PANEL, DISPLAY APPARATUS AND CONTROL METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Yuanyou Qiu, Beijing (CN); Qian Wang, Beijing (CN)

(73) Assignees: CHENGDU BOE OPTOELECTRONICS TECHNOLOGY CO., LTD., Sichuan (CN); BOE TECHNOLOGY GROUP CO. , LTD., Beijing (CN)

( * ) Notice: Subject to any disclaimer, the term of this patent is extended or adjusted under 35 U.S.C. 154(b) by 83 days.

(21) Appl. No.: 17/627,794

(22) PCT Filed: Jan. 22, 2021

(86) PCT No.: PCT/CN2021/073374
§ 371 (c)(1),
(2) Date: Jan. 17, 2022

(87) PCT Pub. No.: WO2022/155914
PCT Pub. Date: Jul. 28, 2022

(65) Prior Publication Data
US 2023/0157143 A1 May 18, 2023

(51) Int. Cl.
*H10K 59/88* (2023.01)
*G09G 3/3233* (2016.01)
*H10K 59/131* (2023.01)

(52) U.S. Cl.
CPC .......... *H10K 59/88* (2023.02); *G09G 3/3233* (2013.01); *H10K 59/131* (2023.02);
(Continued)

(58) Field of Classification Search
CPC .. G09G 3/3258; G09G 3/3233; G09G 3/3291; H10K 59/131
See application file for complete search history.

(56) References Cited

U.S. PATENT DOCUMENTS 10,707,281 B2 * 7/2020 Kuo ...................... G09G 3/3225
11,074,856 B2 * 7/2021 Zhao ................... G09G 3/3266
(Continued)

*Primary Examiner* — Sardis F Azongha
(74) *Attorney, Agent, or Firm* — IP&T Group LLP

(57) ABSTRACT

A display panel has a display area including a light-transmitting region, at least one first region and a second region. The display panel includes sub-pixels disposed in the first region and the second region, second light-emitting devices disposed in the light-transmitting region, data lines and first transistors. The data lines include first and second data lines. A first data line is electrically connected to pixel driving circuits in a column of sub-pixels including at least one dummy sub-pixel, and a second data line is electrically connected to pixel driving circuits in a column of sub-pixels located in a same column as a column of second light-emitting devices. A second light-emitting device in the column of second light-emitting devices is electrically connected to a pixel driving circuit connected to the first data line. The first data line is electrically connected to the second data line through a first transistor.

20 Claims, 12 Drawing Sheets

(52) U.S. Cl.
CPC .............. *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01)

(56) References Cited

U.S. PATENT DOCUMENTS

| | | | |
|---|---|---|---|
| 11,538,874 B2* | 12/2022 | Kim | ............... H04N 23/57 |
| 2020/0098313 A1* | 3/2020 | Bian | ............... G09G 3/3266 |
| 2021/0193785 A1* | 6/2021 | Kim | ............... G09G 3/3291 |

* cited by examiner

DISPLAY PANEL, DISPLAY APPARATUS AND CONTROL METHOD

CROSS-REFERENCE TO RELATED APPLICATION

The present application is a national phase entry under 35 USC 371 of International Patent Application No. PCT/CN2021/073374, filed on Jan. 22, 2021, which is incorporated herein by reference in its entirety.

TECHNICAL FIELD

The present disclosure relates to the field of display technologies, and in particular, to a display panel, a display apparatus and a control method.

BACKGROUND

At present, display screens for electronic devices are developing towards large-screen and full-screen, so as to enable users to have a good visual experience. With development and advancement of technologies, there are more and more researches on a technology of under-display camera. The under-display camera is a camera of an electronic device that is arranged below a display screen to take photographs, and a region of the display screen corresponding to the under-display camera is capable of displaying image, so that a full-screen display is achieved.

SUMMARY

In an aspect, a display panel having a display area is provided. The display area includes a light-transmitting region, at least one first region and a second region, and the at least one first region is located at least at a side of the light-transmitting region. The display panel includes a plurality of sub-pixels disposed in the at least one first region and the second region, a plurality of second light-emitting devices disposed in the light-transmitting region, a plurality of data lines, and first transistors. The plurality of sub-pixels is arranged in a plurality of rows and a plurality of columns, each sub-pixel includes a pixel driving circuit, and the plurality of sub-pixels includes a plurality of effective sub-pixels and a plurality of dummy sub-pixels. The plurality of dummy sub-pixels is disposed in the at least one first region. Each effective sub-pixel further includes a first light-emitting device electrically connected to a pixel driving circuit. The plurality of second light-emitting devices is arranged in a plurality of columns, and each column of second light-emitting devices and a column of sub-pixels are arranged in a column. The plurality of data lines includes first data lines and second data lines. A first data line is electrically connected to pixel driving circuits in a column of sub-pixels including at least one dummy sub-pixel. A second data line is electrically connected to pixel driving circuits in a column of sub-pixels located in a same column as a column of second light-emitting devices, and a second light-emitting device in the column of second light-emitting devices is electrically connected to a pixel driving circuit in a dummy sub-pixel connected to the first data line. The first data line is electrically connected to the second data line through a first transistor.

In some embodiments, in the column of sub-pixels electrically connected to the first data line, sub-pixels located in the first region are all dummy sub-pixels.

In some embodiments, of the plurality of effective sub-pixels, effective sub-pixels located in the first region are uniformly arranged.

In some embodiments, the display panel further includes at least one first connection line and/or at least one second connection line. A first connection line is disposed at a side of the first region away from a signal input terminal of the first data line. An end of the first connection line is electrically connected to a first electrode of the first transistor, and another end of the first connection line is electrically connected to the first data line. A second connection line is disposed at the side of the first region away from the signal input terminal of the first data line. An end of the second connection line is electrically connected to a second electrode of the first transistor, and another end of the second connection line is electrically connected to the second data line.

In some embodiments, the display panel further includes one or more second transistors. At least one second transistor is configured to connect a portion of the first data line located in a first region to a portion of the first data line located in the second region when the at least one second transistor is turned on, and to disconnect the portion of the first data line located in the first region from the portion of the first data line in the second region when the at least one second transistor is turned off. The portion of the first data line located in the first region is electrically connected to the second data line.

In some embodiments, the light-transmitting region is located in a middle of the display area. The portion of the first data line located in the first region serves as a first portion, and the portion of the first data line located in the second region includes a second portion and a third portion that are located at two sides of the first portion. The second portion is closer to a signal input terminal of the first data line than the third portion. The at least one second transistor includes one second transistor, and the first portion and the second portion are electrically connected to a first electrode and a second electrode of the second transistor respectively; or, the at least one second transistor includes two second transistors, the first portion and the second portion are electrically connected to a first electrode and a second electrode of one second transistor of the second transistors, and the first portion and the third portion are electrically connected to a first electrode and a second electrode of another second transistor respectively.

In some embodiments, the display panel further includes capacitors. A first storage electrode of a capacitor is electrically connected to a first electrode of the first transistor, and a second storage electrode of the capacitor is electrically connected to a second electrode of the first transistor.

In some embodiments, in each row of second light-emitting devices, any two adjacent second light-emitting devices have a same distance therebetween. In a row of sub-pixels including at least one dummy sub-pixel and effective sub-pixels, a distance between any two adjacent effective sub-pixels is equal to the distance between two adjacent second light-emitting devices.

In some embodiments, in the row of the sub-pixels including at least one dummy sub-pixel and effective sub-pixels, any two adjacent effective sub-pixels are provided to with three dummy sub-pixels therebetween.

In some embodiments, the at least one first region includes one first region located at a side of the light-transmitting region in a direction perpendicular to an extension direction of the data lines.

In some embodiments, the at least one first region includes two first regions located at two sides of the light-transmitting region in a direction perpendicular to an extension direction of the data lines.

In some embodiments, the at least one first region includes two first regions, one first region is located at a side of the light-transmitting region in a direction perpendicular to an extension direction of the data lines, and another first region is located at a side of the light-transmitting region in the extension direction of the data lines.

In some embodiments, the display panel further includes a plurality of gate lines and a plurality of scan signal connection lines. At least effective sub-pixels in a row of sub-pixels are electrically connected to a gate line. An end of a scan signal connection line is electrically connected to a gate line electrically connected to effective sub-pixels in a same row as a second light-emitting device, another end of the scan signal connection line is electrically connected to a pixel driving circuit, electrically connected to the second light-emitting device, of a dummy sub-pixel, and the pixel driving circuit of the dummy sub-pixel is insulated from a gate line electrically connected to effective sub-pixels in the same row as the dummy sub-pixel.

In some embodiments, the first light-emitting device and the plurality of second light-emitting devices are each an organic light-emitting diode (OLED).

In some embodiments, each second data line has a first winding portion, and the first winding portion detours around the light-transmitting region.

In some embodiments, the plurality of data lines further includes at least one third data line, and a third data line of the at least one third data line is only electrically connected to pixel driving circuits in a column of sub-pixels in which all sub-pixels are effective sub-pixels and is located in a different column from any column of second light-emitting devices.

In some embodiments, the effective sub-pixels electrically connected to the third data line are located at a side of the light-transmitting region in an extension of the data lines. The third data line has a second winding portion, and the second winding portion detours around the light-transmitting region.

In some embodiments, the second light-emitting device is located in a same row as the dummy sub-pixel in which the pixel driving circuit is electrically connected to the second light-emitting device.

In another aspect, a display apparatus is provided. The display apparatus includes the display panel according to any one of the above embodiments and an image sensor located in the light-transmitting region.

In yet another aspect, a control method of a display panel is provided. The method includes: inputting gate scan signals to a plurality of rows of sub-pixels row by row; when a gate scan signal is input to a pixel driving circuit electrically connected to any second light-emitting device in the light-transmitting region, inputting a control signal to the first transistor to turn on the first transistor; inputting data signals to each row of sub-pixels through the plurality of data lines; and transmitting a second data signal from a signal input terminal of the second data line to the pixel driving circuit, electrically connected to the second light-emitting device, through the first data line.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
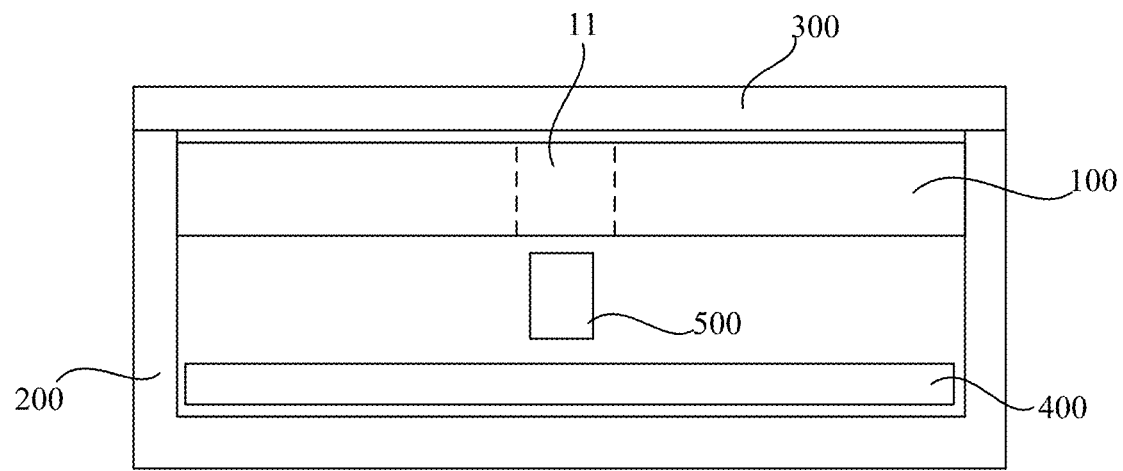
FIG. 1 is a schematic diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

As used herein, the singular form "a/an" also means the plural form, unless the context clearly dictates otherwise. Unless the context requires otherwise, throughout the entire specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments,"

"exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "connected" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting," depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]," depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional views and/or plan views as idealized exemplary drawings. In the accompanying drawings, thickness of layers and sizes of regions are enlarged for clarity. Exemplary embodiments of the present disclosure should not be construed to be limited to shapes of regions shown herein, but to include deviations in shape due to, for example, manufacturing. For example, an etched area shown as a rectangle generally has a curved feature. Therefore, the areas shown in the accompanying drawings are schematic in nature, and their shapes are not intended to show actual shapes of the area in a device, and are not intended to limit the scope of the exemplary embodiments.

Some embodiments of the present disclosure provide a display apparatus. The display apparatus may serve as a mobile phone, a tablet computer, a personal digital assistant (PDA), a vehicle-mounted computer, or the like. A usage of the display apparatus is not limited in the embodiments of the present disclosure.

As shown in FIG. 1, the display apparatus includes a display panel 100, a frame 200, a cover plate 300, a circuit board 400, an image sensor 500 and other electronic accessories. For example, a longitudinal section of the frame 200 is U-shaped, and the display panel 100, the circuit board 400, and the image sensor 500 are disposed in a cavity enclosed by the frame 200 and the cover plate 300. The circuit board 400 is disposed on a side of the display panel 100 away from the cover plate 300.

In some examples, the image sensor 500 is a camera. For example, the camera is disposed on a side of the display panel 100 away from the cover plate 300.

In some examples, the circuit board 400 is configured to provide the display panel 100 with signals required for display. For example, the circuit board 400 is a printed circuit board assembly (PCBA). The PCBA includes a printed circuit board (PCB), and a timing controller (TCON), a power management integrated circuit (PMIC), and other ICs or circuitry that are disposed on the PCB.

Figure 2A:
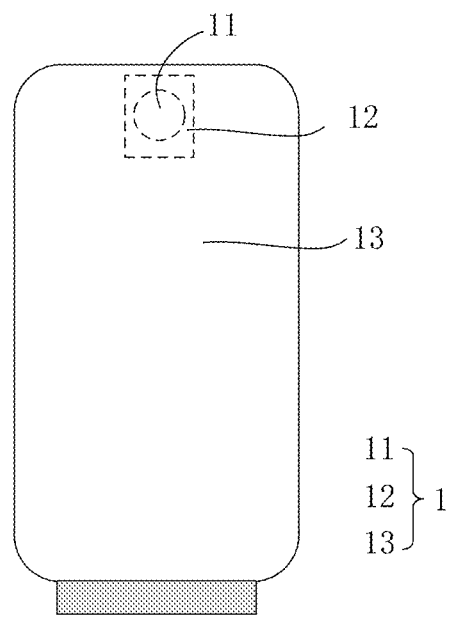
FIG. 2A is a plane schematic diagram of a display panel, in accordance with some embodiments.
Figure 2B:
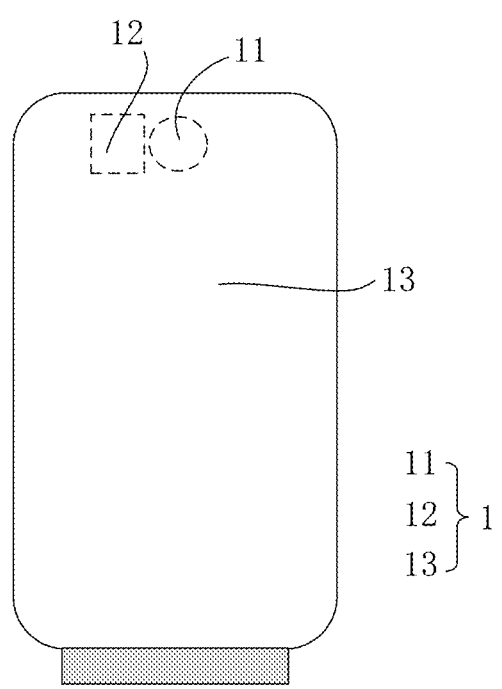
FIG. 2B is a plane schematic diagram of another display panel, in accordance with some embodiments.

Some embodiments of the present disclosure provide a display panel 100. As shown in FIGS. 2A and 2B, the display panel has a display area 1. The display area 1 includes a light-transmitting region 11, at least one first region 12 and a second region 13. For example, as shown in FIG. 2A, the first region 12 is arranged on a side of the light-transmitting region 11. For another example, as shown in FIG. 2B, the first region 12 is arranged around the light-transmitting region 11.

In some examples, as shown in FIG. 1, the light-transmitting region 11 is a region corresponding to an installation position of the image sensor in a thickness direction of the display apparatus. The light-transmitting region 11 may also display images based on image acquisition by the camera, so that the display panel 100 may achieve a full-screen display.

For example, as shown in FIGS. 2A and 2B, the light-transmitting region 11 is in a shape of a circle. For another example, the light-transmitting region 11 is in a shape of a rectangle. For example, the first region 12 is in a shape of a rectangle. The shapes of the light-transmitting region 11 and the first region 12 are not limited in the embodiments of the present disclosure, and may be set reasonably according to actual conditions.

Figure 3A:
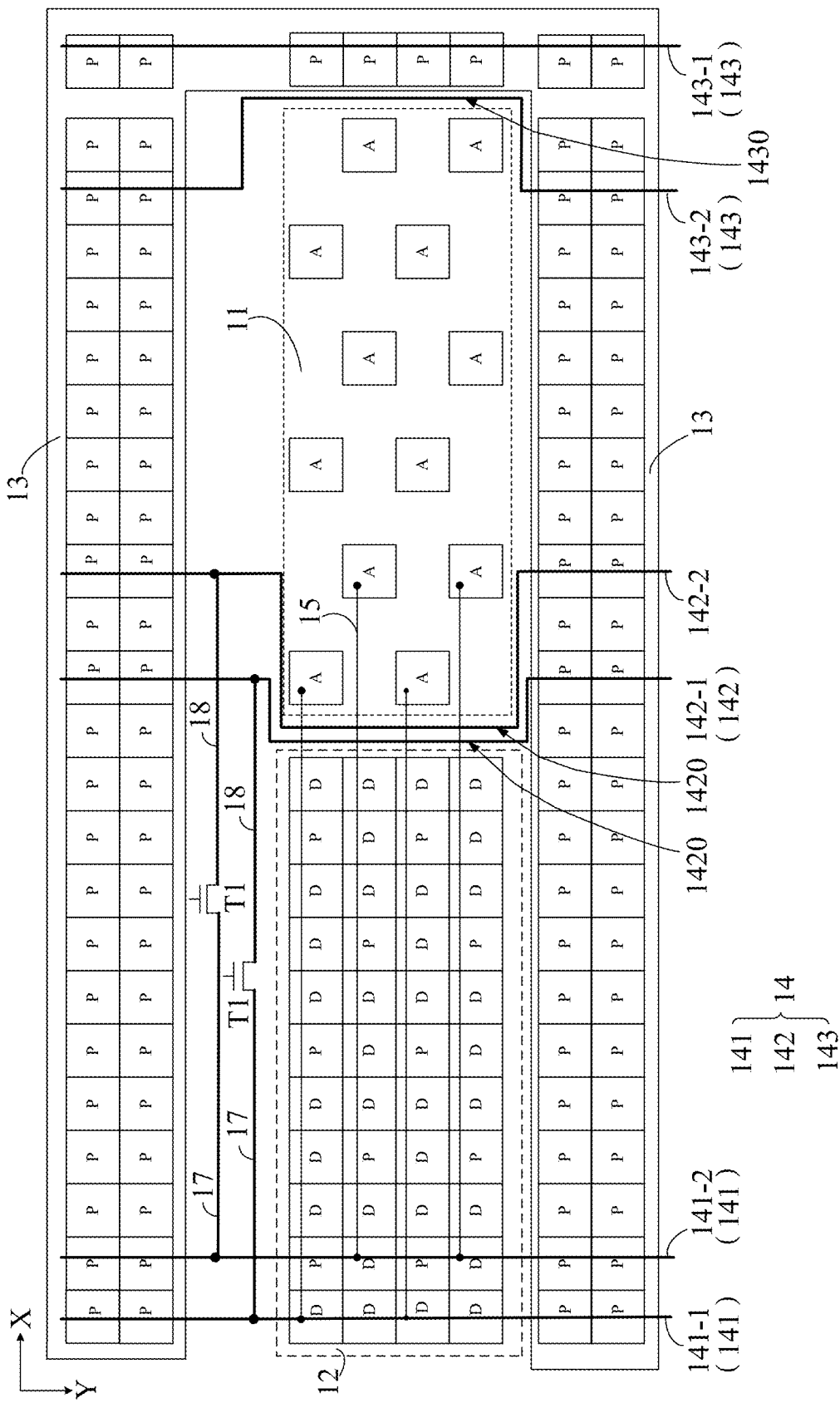
FIG. 3A is a schematic diagram of a display panel, in accordance with some embodiments.
Figure 3B:
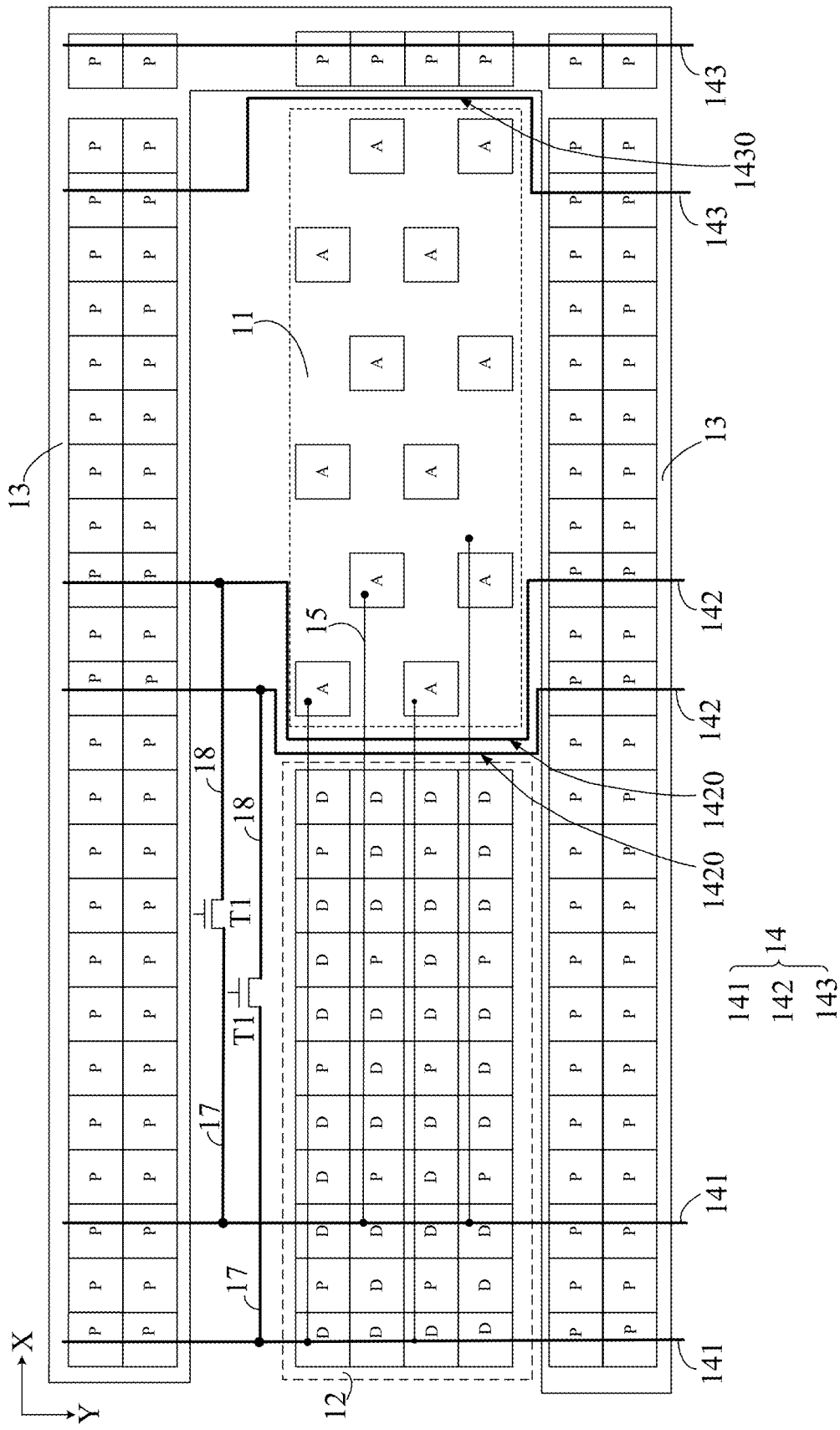
FIG. 3B is a schematic diagram of another display panel, in accordance with some embodiments.

The display panel 100 includes a plurality of sub-pixels disposed in the first region 12 and the second region 13, and the plurality of sub-pixels are arranged in a plurality of rows and a plurality of columns. For example, as shown in FIGS. 3A and 3B, the plurality of sub-pixels are arranged in eight rows and twenty-four columns in which a first column to a twenty-fourth column are arranged in sequence in an X direction and a first row to an eighth row are arranged in sequence in a Y direction. The number of the sub-pixels in the display panel 100, the number of rows in which the plurality of sub-pixels are arranged, the number of columns in which the plurality of sub-pixels are arranged, the number of sub-pixels in each row of sub-pixels, and the number of sub-pixels in each column of sub-pixels are all related to a resolution of the display panel and the like. A plurality of sub-pixels shown in FIGS. 3A and 3B are some of the sub-pixels in the display panel 100, and FIGS. 3A and 3B are merely an illustration of an arrangement manner of the plurality of sub-pixels arranged into the plurality of rows and the plurality of columns. The number of the sub-pixels and the arrangement manner of the plurality of sub-pixels are not limited in the embodiments of the present disclosure, as long as the plurality of sub-pixels may be arranged in the plurality of rows and the plurality of columns.

As shown in FIGS. 3A and 3B, the plurality of sub-pixels include a plurality of effective sub-pixels P and a plurality of dummy sub-pixels D. The plurality of effective sub-pixels P are arranged in the first region 12 and the second region 13, and the plurality of dummy sub-pixels D are arranged in the first region 12.

Figure 11:
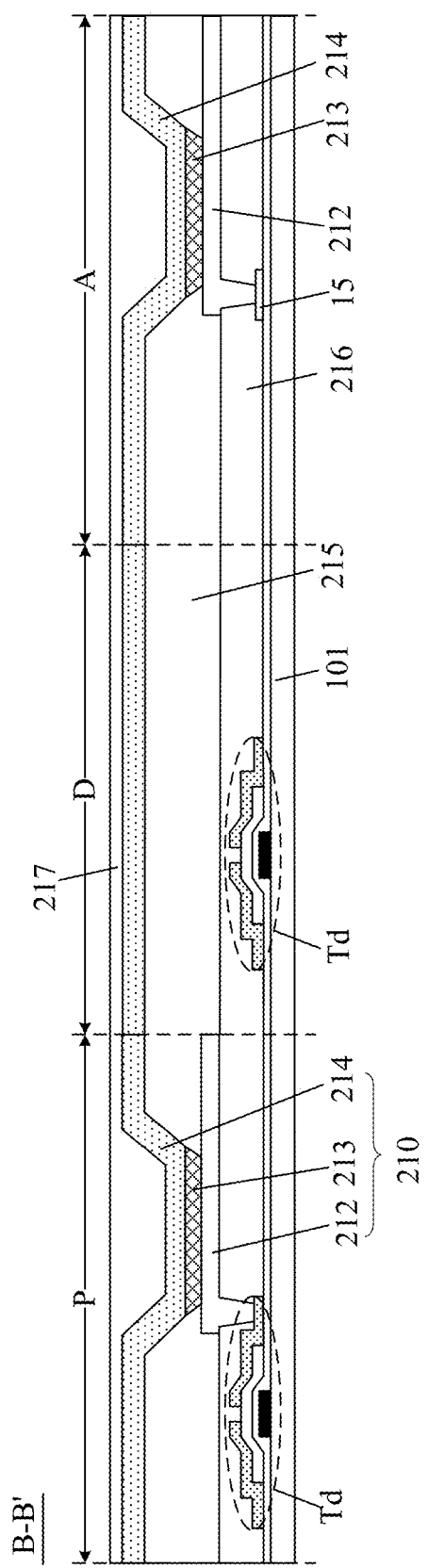
FIG. 11 is a sectional view taken along the line B-B' in FIG. 8, in accordance with some embodiments.

As shown in FIG. 11, each effective sub-pixel P includes a pixel driving circuit and a first light-emitting device 210 electrically connected to the pixel driving circuit. Each dummy sub-pixel D includes only a pixel driving circuit. For example, a circuit structure of the pixel driving circuit in each effective sub-pixel P is the same as a circuit structure of the pixel driving circuit in each dummy sub-pixel D.

As shown in FIGS. 3A and 3B, the display panel further includes a plurality of second light-emitting devices A disposed in the light-transmitting region 11. The plurality of second light-emitting devices A are arranged in a plurality of columns, and each column of second light-emitting devices A and a column of sub-pixels are arranged in a column.

In the embodiments of the present disclosure, a plurality of sub-pixels that are electrically connected to a single signal line are referred to as a column of sub-pixels. The signal line is a data line. A plurality of second light-emitting devices A arranged in a same direction as sub-pixels in a column are referred to as a column of second light-emitting devices A. A plurality of sub-pixels arranged in a line in an extension direction of another signal line are referred to as a row of sub-pixels. The another signal line is a gate line hereinafter. A plurality of second light-emitting devices A arranged in a same direction as sub-pixels in a row are referred to as a row of second light-emitting devices A.

For example, a plurality of second light-emitting devices A are arranged in four rows and six columns as shown in FIGS. 3A and 3B. That is, there are a first column to a sixth column in the X direction in sequence, and a first row to a fourth row in the Y direction in sequence. Each column of second light emitting devices A has a same number of second light emitting devices A, and each row of second light emitting devices A has a same number of second light emitting devices A. The number of the second light-emitting devices A in the light-transmitting region 11, the number of rows in which the plurality of second light-emitting devices A are arranged, the number of columns in which the plurality of second light-emitting devices A are arranged, the number of the second light-emitting devices A in each row of second light-emitting devices A, and the number of the second light-emitting devices A in each column of second light-emitting devices A are related to a size and a resolution of the light-transmitting region 11. An arrangement manner of the plurality of second light-emitting devices A shown in FIGS. 3A and 3B is merely an illustration, and the number of second light-emitting devices A and the manner of a plurality of second light-emitting devices A arranged into a plurality of columns are not limited in the embodiments of the present disclosure.

Herein, the light-transmitting region 11 is only provided with the plurality of second light-emitting devices A therein, and the plurality of second light-emitting devices A are uniformly arranged at intervals, so that a light transmittance of the light-transmitting region 11 may be increased and the light-transmitting region have a good display effect.

For example, referring to FIGS. 3A and 3B, the first column of second light-emitting devices A in the light-transmitting region 11 and a thirteenth column of sub-pixels in the display area 1 are arranged in a column. For another example, a second column of second light-emitting devices A in the light-transmitting region 11 and a fifteenth column of sub-pixels in the display area 1 are arranged in a column.

In some examples, the plurality of first light-emitting devices includes a plurality of first light-emitting devices configured to emit red light, a plurality of first light-emitting devices configured to emit green light, and a plurality of first light-emitting devices configured to emit blue light.

In some examples, the plurality of second light-emitting devices includes a plurality of second light-emitting devices configured to emit red light, a plurality of second light-emitting devices configured to emit green light, and a plurality of second light-emitting devices configured to emit blue light.

Of course, the plurality of first light-emitting devices may also include first light-emitting devices for emitting white light. The plurality of second light-emitting devices A may also include second light-emitting devices A for emitting white light.

In some examples, the first light-emitting devices 210 are organic light-emitting diodes (OLEDs).

In some embodiments, the second light-emitting devices A are OLEDs.

As shown in FIGS. 3A and 3B, the display panel 100 further includes a plurality of data lines 14. Pixel driving circuits in a column of sub-pixels are electrically connected to one data line 14. The plurality of data lines 14 include first data line(s) 141 and second data line(s) 142. For example, the first data line 141(*s*) include a plurality of first data lines 141, and the second data line(s) 142 include a plurality of second data lines 142.

For example, the plurality of data lines 14 are disposed in a same layer. For another example, at least some of the plurality of data lines 14 are disposed in a same layer. A plurality of data lines 14 disposed in the same layer are simultaneously formed by a patterning process.

In the embodiments of the present disclosure, FIG. 3A and FIG. 3B only show some data lines, actually, sub-pixels in each column are electrically connected to one data line.

A first data line 14 is electrically connected to pixel driving circuits in a column of sub-pixels including dummy sub-pixel(s) D. For example, as shown in FIG. 3A, sub-pixels in the first column include dummy sub-pixels D, and a first data line 141-1 is electrically connected to pixel driving circuits in the sub-pixels in the first column. For another example, as shown in FIG. 3A, sub-pixels in a second column include dummy sub-pixels D and effective sub-pixels P, and a first data line 141-2 is electrically connected to pixel driving circuits in the sub-pixels in the second column.

A second data line 142 is electrically connected to pixel driving circuits in a column of sub-pixels located in a same column as a column of second light-emitting devices A. A second light-emitting device A in the column of second light-emitting devices A is connected to a pixel driving circuit, connected to a first data line, in a dummy sub-pixel D. For example, as shown in FIG. 3A, the first column of second light-emitting devices A in the light-transmitting region 11 and the thirteenth column of sub-pixels are located in the same column, and a second data line 142-1 is electrically connected to pixel driving circuits in the sub-pixels in the thirteenth column. For another example, as shown in FIG. 3A, the second column of second light-emitting devices A in the light-transmitting region 11 and the fifteenth column of sub-pixels are located in the same column, and a second data line 142-2 is electrically connected to pixel driving circuits in the sub-pixels in the fifteenth column.

As shown in FIGS. 3A and 3B, each second data line 142 has a first winding portion 1420, and the first winding portion 1420 detours around the light-transmitting region 11, so that the second data line 142 does not pass through the light-transmitting region 11, so as to avoid an influence of the second data line 142 on the light transmittance of the light-transmitting region 11.

In some examples, as shown in FIG. 3A, the plurality of data lines 14 further include third data line(s) 143. For example, the third data line(s) 143 include a plurality of third data lines 143. A third data line 143 is only electrically connected to pixel driving circuits in a column of sub-pixels in which all sub-pixels are effective sub-pixels P and is located in a different column from any column of second light-emitting devices A. That is, the third data line 143 is only electrically connected to pixel driving circuits in the column of effective sub-pixels P that is located in the second region and located in the different column from any column of second light-emitting devices A.

For example, as shown in FIG. 3A, effective sub-pixels P in the twenty-fourth column and second light-emitting devices A in any column are located in different columns, and the effective sub-pixels P in the twenty-fourth column are all located in the second region 13. A third data line 143-1 is electrically connected to pixel driving circuits in the effective sub-pixels P located in the twenty-fourth column.

For another example, as shown in FIG. 3A, effective sub-pixels P in a twenty-second column and second light-emitting devices A in any column are located in different columns, and the effective sub-pixels P in the twenty-second column are all located in the second region 13. A third data line 143-2 is electrically connected to pixel driving circuits in the effective sub-pixels P located in the twenty-second column. The third data line 143-2 has a second winding portion 1430, and the second winding portion 1430 detours around the light-transmitting region 11, so that the third data line 143-2 does not pass through the light-transmitting region 11, so as to avoid an influence of the third data line 143-2 on the light transmittance of the light-transmitting region 11. If effective sub-pixels P electrically connected to a third data line 143 are located at a side of the light-transmitting region in an extension direction of the data line 14, the third data line needs to be provided with a second winding portion 1430.

In some examples, a second light-emitting device A located in the first column and the first row in the light-transmitting region 11 is electrically connected to a pixel driving circuit in a dummy sub-pixel D located in the first column and a third row. For example, as shown in FIGS. 3A and 3B, a second light-emitting device A is connected to a pixel driving circuit in a dummy sub-pixel D through an auxiliary connection line 15.

Herein, FIGS. 3A and 3B are only illustrations. Although only some second light-emitting devices A are connected to pixel driving circuits in dummy sub-pixels D in FIGS. 3A and 3B, it does not mean that the only some second light-emitting devices A in the light-transmitting region 11 are electrically connected to the pixel driving circuits in the dummy sub-pixels D. Actually, each second light-emitting device A in the light-transmitting region 11 is electrically connected to a pixel driving circuit in a corresponding dummy sub-pixel D.

For example, a material of the auxiliary connection line 15 is indium tin oxide (ITO). ITO is transparent in a form of a film, and thus the auxiliary connection line made of ITO is transparent. Therefore, the auxiliary connection line hardly affects the light transmittance of the light-transmitting region 11. For example, a plurality of auxiliary connection lines 15 are disposed in the same layer. For another example, at least some of a plurality of auxiliary connection lines 15 and the plurality of data lines 14 are disposed in the same layer. A plurality of auxiliary connection lines 15 disposed in the same layer are simultaneously formed by a patterning process.

Figure 10A:
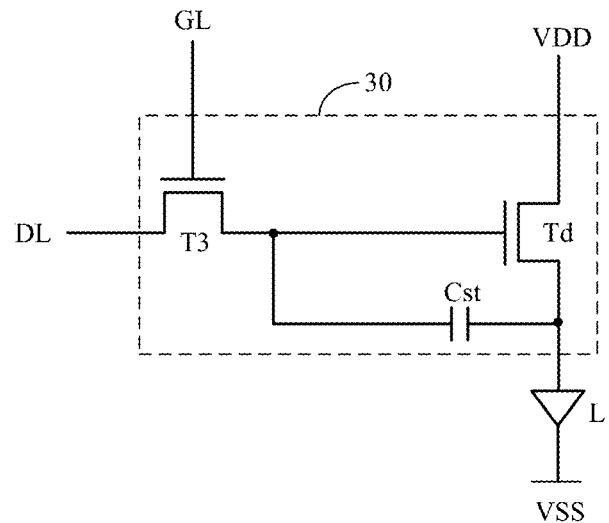
FIG. 10A is an equivalent circuit diagram of a sub-pixel, in accordance with some embodiments.

In some examples, as shown in FIG. 10A, a pixel driving circuit 30 includes a driving transistor Td, a third transistor T3 and a first storage capacitor Cst. That is, a circuit structure of the pixel driving circuit 30 is a 2T1C circuit structure. It will be understood by those skilled in the art that in the pixel driving circuit 30, a width-length ratio of a channel of the driving transistor Td is greater than width-length ratios of channels of other transistors (e.g., the third transistor T3) that function as switches.

As shown in FIG. 10A, a gate of the third transistor T3 is electrically connected to a scan signal line GL, a first electrode of the third transistor T3 is electrically connected to a data signal DL (i.e., a data line 14 in the display panel 100), and a second electrode of the third transistor T3 is electrically connected to a gate of the driving transistor Td. A first electrode of the driving transistor Td is electrically connected to a first power line VDD, and a second electrode of the driving transistor Td is electrically connected to an anode of a light-emitting device L (i.e., the first light-emitting device 210 or the second light-emitting device A in the display panel). A cathode of the light-emitting device L is electrically connected to a second power line VSS. A terminal of the first storage capacitor Cst is electrically connected to the gate of the driving transistor Td, and the other terminal of the first storage capacitor Cst is electrically connected to the second electrode of the driving transistor Td. For example, the first power line VDD is configured to provide a high voltage signal, and the second power line VSS is configured to provide a low voltage signal.

Figure 10B:
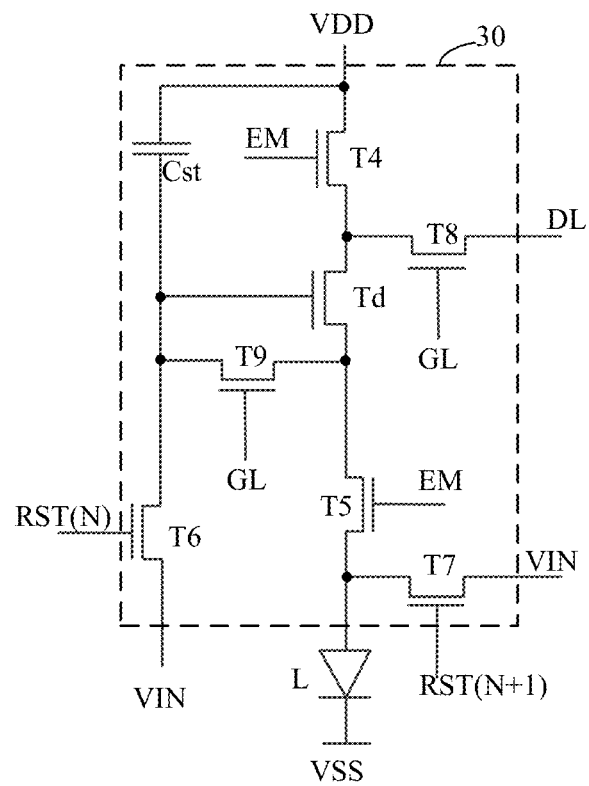
FIG. 10B is an equivalent circuit diagram of another sub-pixel, in accordance with some embodiments.

In some other examples, as shown in FIG. 10B, the pixel driving circuit 30 includes a driving transistor Td, a fourth transistor T4, a fifth transistor T5, a sixth transistor T6, a seventh transistor T7, an eighth transistor T8, a ninth transistor T9, and a first storage capacitor Cst. That is, the circuit structure of the pixel driving circuit is a 7T1C circuit structure.

As shown in FIG. 10B, a gate of the eighth transistor T8 is electrically connected to a scan signal line GL, a first electrode of the eighth transistor T8 is electrically connected to a data signal DL (i.e., a data line 14 in the display panel 100), and a second electrode of the eighth transistor T8 is electrically connected to a first electrode of the driving transistor Td. A gate of the ninth transistor T9 is electrically connected to the scan signal terminal GL, and a first electrode and a second electrode of the ninth transistor T9 are electrically connected to a second electrode and a gate of the driving transistor Td, respectively. A gate of the fourth transistor T4 is electrically connected to an enable signal line EM, a first electrode of the fourth transistor T4 is electrically connected to a first power line VDD, and a second electrode of the fourth transistor T4 is electrically connected to the first electrode of the driving transistor Td. A gate of the fifth transistor T5 is electrically connected to the enable signal line EM, a first electrode of the fifth transistor T5 is electrically connected to the second electrode of the driving transistor Td, and a second electrode of the fifth transistor T5 is electrically connected to an anode of a light-emitting device L. A gate of the sixth transistor T6 is electrically connected to a reset signal line RST(N), a first electrode of the sixth transistor T6 is electrically connected to an initialization signal line VIN, and a second electrode of the sixth transistor T6 is electrically connected to the gate of the driving transistor Td. A gate of the seventh transistor T7 is electrically connected to a reset signal line RST(N+1) that is connected to a sixth transistor T6 of a pixel driving circuit 30 in a next row, a first electrode of the seventh transistor T7 is electrically connected to the initialization signal line VIN, and a second electrode of the seventh transistor T7 is electrically connected to the anode of the light-emitting device L (i.e., the first light-emitting device 210 or the second light-emitting device A in the display panel). A terminal of the first storage capacitor Cst is electrically connected to the gate of the driving transistor Td, and the other terminal of the storage capacitor Cst is electrically connected to the first power line VDD. A cathode of the light-emitting device L is electrically connected to a second power line VSS. For example, the first power line VDD is configured to provide a high voltage signal, and the second power line VSS is configured to provide a low voltage signal.

The above is merely examples for the pixel driving circuit 30. The circuit structure of the pixel driving circuit 30 is not limited to the two structures described above, and may be other types of circuit structure, which will not be listed herein. However, it will be understood that, regardless of which circuit structure the pixel driving circuit 30 has, the pixel driving circuit 30 includes at least a driving transistor, a transistor function as a switch, and a storage capacitor.

In the embodiments of the present disclosure, a first electrode is one of a source and a drain of a transistor, and a second electrode is the other of the source and the drain of the transistor. Since the source and the drain of the transistor may be symmetrical in structure, there may be no difference in structure between the source and the drain of the transistor. That is, there may be no difference in structures between the first electrode and the second electrode of the transistor in the embodiments of the present disclosure. For example, for a P-type transistor, a second electrode is referred to as a drain, and a first electrode is referred to as a source. For another example, for an N-type transistor, a first electrode is referred to as a drain, and a second electrode is referred to as a source.

In addition, transistors may be divided into enhancement-mode transistors and depletion-mode transistors according to different conduction modes of the transistors. The transistors in the embodiments of the present disclosure may be the enhancement-mode transistors or the depletion-mode transistors, which are not limited.

For example, each sub-pixel has a same pixel driving circuit 30. The pixel driving circuits 30 in the plurality of sub-pixels are synchronously formed through a patterning process.

Figure 4A:
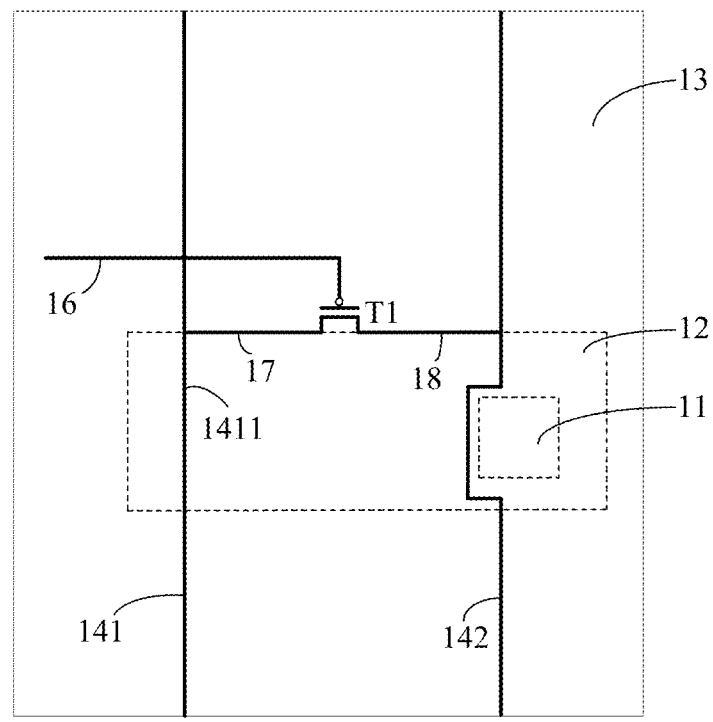
FIG. 4A is a schematic diagram of yet another display panel, in accordance with some embodiments.

The display panel 100 further includes a plurality of first transistors. Referring to FIGS. 3A, 3B and 4A, a first data line 141 is connected to a second data line 142 through a first transistor T1. The first transistor T1 is configured to connect the first data line 141 and the second data line 142 together when the first transistor T1 is turned on, and to disconnect the first data line 141 and the second data line 142 when the first transistor T1 is turned off.

For example, the plurality of first transistors T1 are synchronously formed through a patterning process.

Figure 4B:
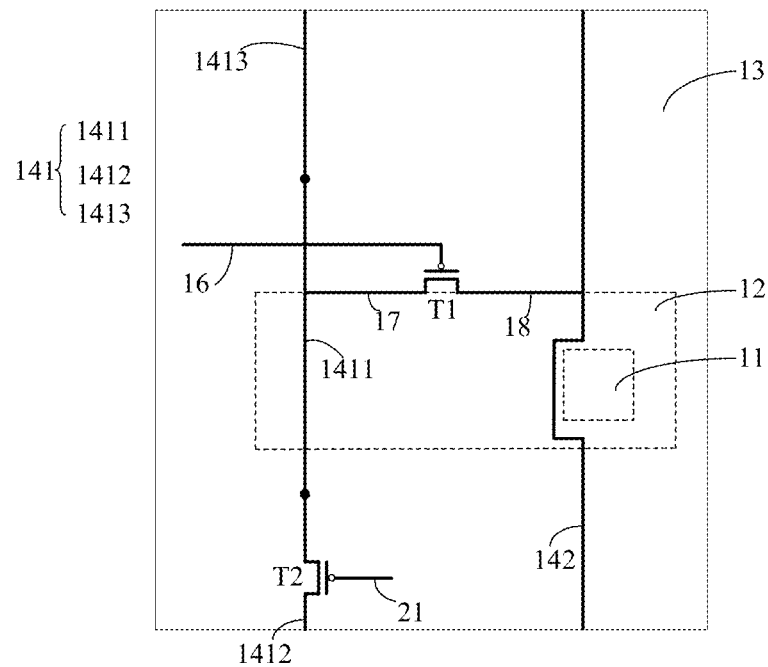
FIG. 4B is a schematic diagram of yet another display panel, in accordance with some embodiments.
Figure 4C:
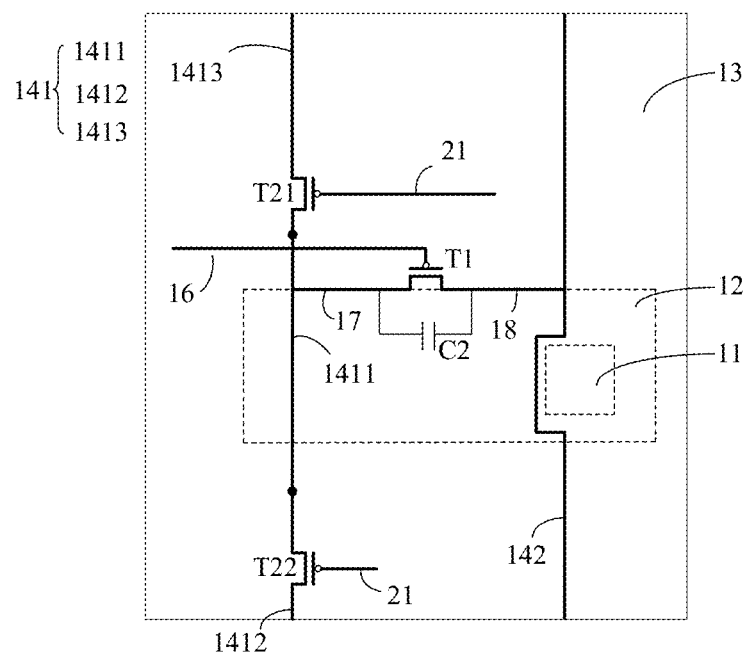
FIG. 4C is a schematic diagram of yet another display panel, in accordance with some embodiments.

In some example, as shown in FIGS. 4A to 4C, a gate of a first transistor T1 is connected to a first control terminal through a first control line 16. A first control signal from the first control terminal is transmitted to the first transistor T1 through the first control line 16 to control the first transistor T1 to be turned on or turned off. For example, the first transistor T1 is an N-type transistor, and the first transistor T1 is turned on in response to the first control signal from the first control terminal as a high-level signal. For another example, the first transistor T1 is the P-type transistor, and the first transistor T1 is turned on in response to the first control signal from the first control terminal as a low-level signal.

In the embodiments of the present disclosure, as shown in FIGS. 3A and 3B, in a case where the first transistor T1 is turned on, the first data line 141 and the second data line 142 are connected as a whole, and a second data signal from a signal input terminal of the second data line 142 is transmitted to a pixel driving circuit electrically connected to a second light-emitting device A through the whole of the second data line 142 and the first data line 141 that are connected, so as to control the second light-emitting device A to emit light. In this way, the light-transmitting region 11 of the display panel displays an image.

It will be noted that, in the case where the first transistor T1 is turned on, the first data line 141 does not transmit a first data signal to a pixel driving circuit, in a dummy sub-pixel D, electrically connected to the second light-emitting device A, so as to prevent the first data signal and the second data signal from interfering with each other. For example, when the first transistor T1 is turned on, a processor may control a signal input terminal of the first data line 141 not to output the first data signal or not to output a data signal that is capable of causing the second light emitting device A to emit light. For example, the processor may control the signal input terminal of the first data line output a dummy first data signal; alternatively, a control switch (e.g., a second transistor T2 below) may disconnect the first data line 141 from the second data line 142, so as to prevent the first data signal from the signal input terminal of the first data line 141 from being transmitted to the pixel driving circuit electrically connected to the second light-emitting device A.

In the case where the first transistor T1 is turned off, the first data line 141 is disconnected to the second data line 142, and the first data signal, from the signal input terminal of the first data line 141, is transmitted to the pixel driving circuits electrically connected to the first data line 141, so that a column of effective sub-pixels P electrically connected to the first data line 141 may display an image normally.

In this way, compared with a case where the first data line 141 is directly electrically connected to the second data line 142 through a connection line, and the light-transmitting region may be located only at the top of the display area 1, in the embodiments of the present disclosure, the light-transmitting region 11 may be located at any position of the display area 1 without affecting the normal display of the second region 13.

In the embodiments of the present disclosure, distances between rows of sub-pixels in the display panel 100 are equal, and distances between columns of sub-pixels are also equal, so that the display panel 100 has a good display effect. In order to more clearly illustrate the connection between the first data line 141 and the second data line 142, and a wiring manner of the data lines, a distance between the second row of sub-pixels and the third row of sub-pixels, a distance between the sixth row of sub-pixels and the seventh row of sub-pixels, and a distance between a twenty-third column of sub-pixels and the twenty-fourth column of sub-pixels are shown in FIGS. 3A and 3B only as an illustration, and they do not represent actual distances between the sub-pixels in the display panel.

In some embodiments, the first transistor T1 is a thin film transistor (TFT).

In some example, as shown in FIG. 11, the display panel 100 includes a base 101. The pixel driving circuit in each sub-pixel is disposed on the base 101. For example, the base 101 is a glass base.

The driving transistor Td in each pixel driving circuit includes an active layer, a source, a drain, a gate and a portion of a gate insulating layer between the gate and the active layer, and the source and the drain are in contact with the active layer.

For example, a material of the active layer includes one of amorphous indium gallium zinc oxide (a-IGZO), zinc oxynitride (ZnON), indium zinc tin oxide (IZTO), amorphous silicon (a-Si), polycrystalline silicon (p-Si), sexithiophene or polythiophene.

Referring to FIG. 11, the first light-emitting device 210 in each effective sub-pixel P includes an anode 212, a light-emitting functional layer 213, and a cathode 214. Each second light-emitting device A also includes an anode 212, a light-emitting functional layer 213, and a cathode 214.

For example, the light-emitting functional layer 213 only includes a light-emitting layer. For another example, other than the light-emitting layer, the light-emitting functional layer 213 further includes one or more of an electron transport layer (ETL), an electron injection layer (EIL), a hole transport layer (HTL) and a hole injection layer (HIL).

In some examples, the anodes 212 of the first light-emitting device 210 and the second light-emitting device A proximate to the base 101 is opaque, and the cathodes 214 of the first light-emitting device and the second light-emitting device A away from the base 101 is transparent or translucent.

In some other examples, the anodes 212 of the first light-emitting device 210 and the second light-emitting device A proximate to the base 101 is transparent or translucent, and the cathodes 214 of the first light-emitting device and the second light-emitting device A away from the base 101 is opaque.

In some examples, as shown in FIG. 11, the display panel 100 further includes a pixel defining layer 215. The pixel defining layer 215 includes a plurality of opening, and a first light-emitting device 210 is disposed in one opening, and a second first light-emitting device A is disposed in one opening.

In yet some other examples, as shown in FIG. 11, the display panel 100 further includes a planarization layer 216 disposed between pixel driving circuits and light-emitting devices. The anode of the first light-emitting device 210 is electrically connected to a second electrode of a driving transistor Td in the pixel driving circuit through a via hole provided in the planarization layer 216. The anode of the second light-emitting device A is connected to the auxiliary connection line 15 through another via hole provided in the planarization layer 216.

For example, a material of the planarization layer 50 includes, but is not limited to, a polysiloxane-based material, an acrylic-based material or a polyimide-based material.

In some other examples, as shown in FIG. 11, the display panel 100 further includes an encapsulation layer 217.

In some embodiments, as shown in FIG. 3B, in a column of sub-pixels electrically connected to a first data line 141, sub-pixels located in the first region 12 are all dummy sub-pixels D.

In a scanning phase of a frame period, pixel driving circuits in rows of sub-pixels are scanned row by row. That is, a scanning is performed row by row from pixel driving circuits located in the first row of sub-pixels, and a corresponding data signal is transmitted to each pixel driving circuit in the rows of sub-pixels in sequence, until data signals are input to pixel driving circuits located in the last row of sub-pixels in the display area 1.

Based on this, in a process of scanning a sub-pixel row where second light-emitting devices A in the light-transmitting region 11 are located, the first transistors T1 may be turned on continuously until all pixel driving circuits electrically connected to the last row of the second light-emitting devices A in the light-transmitting region 11 are scanned.

For example, referring to FIG. 3B, when the processor inputs a gate scan signal to pixel driving circuits in the third row (i.e., a sub-pixel row in a same row as second light-emitting devices A in the first row in the light-transmitting region 11), it also inputs a first control signal to first transistors to turn on the first transistors T1. A first data line 141 is connected to a second data line 142 as a whole through a turned-on first transistor T1, and a second data signal is transmitted to a pixel driving circuit that is electrically connected to the first data line 141 and located in a dummy sub-pixel D in the third row, so that a second light-emitting device A that is electrically connected to the dummy sub-pixel D and located in the first row in the light-transmitting region 11 emits light. When the processor transmits a scan signal to pixel driving circuits in the fourth row, the second data signal is transmitted to a pixel driving circuit that is electrically connected to the first data line 141 and in a dummy sub-pixel D in the fourth row, so that a second light-emitting device A that is electrically connected to the dummy sub-pixel D and located in the second row in the light-transmitting region 11 emits light. Until the second data signal is transmitted to a pixel driving circuit that is electrically connected to the first data line 141 and in a dummy sub-pixel D in the sixth row, so that a second light-emitting device A that is electrically connected to the dummy sub-pixel D and located in the fourth row (i.e., a sub-pixel row in a same row as second light-emitting devices A in the last row in the light-transmitting region 11) in the light-transmitting region 11 emits light. In this way, all sub-pixel rows where second light-emitting devices A in the light-transmitting region 11 are located are scanned. In this case, the processor inputs the first control signal to the gate of the first transistors T1, so that the first transistors T1 are turned off.

In some other embodiments, as shown in FIG. 3A, in a column of sub-pixels electrically connected to the first data line 141-2, sub-pixels located in the first region 12 include dummy sub-pixels D and effective sub-pixels P.

Based on this, in a process of scanning a sub-pixel row where a second light-emitting device A in the light-transmitting region 11 is located, if a sub-pixel electrically connected to a first data line 141 is an effective sub-pixel P, a first transistor T1 connected to the first data line 141 is turned off; if a sub-pixel electrically connected to a first data line 141 is a dummy sub-pixel P, and the dummy sub-pixel D is electrically connected to a second light-emitting device A of the light-transmitting region 11, a first transistor T1 connected to the first data line 141 is turned on.

For example, referring to FIG. 3A, when the processor inputs a gate scan signal to the pixel driving circuits in the third row (i.e., a sub-pixel row in a same row as the second light-emitting devices A in the first row in the light-transmitting region 11), it also inputs the first control signal to a first transistor T1 electrically connected to the first data line 141-2 to turn off the first transistor T1. A sub-pixel in the fourth row of sub-pixels electrically connected to the first data line 141-2 is a dummy sub-pixel D, and the dummy sub-pixel D is electrically connected to a second light-emitting device A in the second row in the light-transmitting region 11, therefore, when the processor inputs the gate scan signal to pixel driving circuits in the fourth row (i.e., a sub-pixel row in a same row as second light-emitting devices A in the second row in the light-transmitting region 11), the processor further inputs the first control signal to the first transistor T1 electrically connected to the first data line 141-2, so that the first transistor T1 is turned on.

In some embodiments, as shown in FIGS. 3A and 3B, of the plurality of effective sub-pixels P, effective sub-pixels P located in the first region 12 are uniformly arranged. In this way, the first region 12 may have a good display effect.

In some embodiments, the display panel 100 further includes first connection line(s). A first connection line is disposed at a side of a first region 12 away from signal input terminals of the data lines 14. An end of the first connection line is electrically connected to a gate of a first transistor T1, and the other end of the first connection line is electrically connected to a first data line 141, and a second electrode of the first transistor T1 is electrically connected to a second data line 142.

In some other embodiments, the display panel 100 further includes second connection line(s). A second connection lines is disposed at a side of a first region 12 away from signal input terminals of the data lines 14. An end of the second connection line is electrically connected to a second electrode of a first transistor T1, the other end of the second connection line is electrically connected to the second data line 142, and a first electrode of the first transistor T1 is electrically connected to a first data line 141.

In yet some other embodiments, as shown in FIGS. 3A, 3B, and 4A to 4C, the display panel 100 further includes first connection lines 17 and second connection lines 18. A first connection line 17 and a second connection line 18 are all disposed at a side of a first region 12 away from signal input terminals of the data lines 14.

For example, the first connection lines 17 and the second connection lines 18 are all arranged in a sub-pixel row where dummy sub-pixels D electrically connected to the second light-emitting devices A in the first row in the light-transmitting region 11 are located. For example, first connection lines 17 and second connection lines 18 are all arranged in a region where the third row of sub-pixels in FIG. 3B are located. For example, the first connection lines 17 and the second connection lines 18 are disposed in a same layer. For another example, the first connection lines 17 and the second connection lines 18 are arranged in a same layer as at least some of the plurality of data lines 14. For yet another example, a first connection line 17 and a second connection line 18 electrically connected to one first transistor T1 are arranged in a same layer as the first transistor T1.

An end of the first connection line is electrically connected to a first electrode of a first transistor T1, and the other end of the first connection line is electrically connected to a first data line 141. An end of the second connection line 18 is electrically connected to a second electrode of the first transistor T1, and the other end of the second connection line 18 is electrically connected to a second data line 142.

In some embodiments, as shown in FIGS. 4B and 4C, the display panel 100 further includes one or more second transistors T2. At least one second transistor T2 is configured to connect a portion of the first data line 141 located in a first region 12 to a portion of the first data line 141 located in the second region 13 when the second transistor T2 is turned on, and to disconnect the portion of the first data line 141 located in the first region 12 from the portion of the first data line 141 in the second region 13 when the second transistor T2 is turned off. In this case, the portion of the first data line 141 located in the first region 12 is electrically connected to the second data line 142.

For example, the second transistor T2 is a thin film transistor (TFT).

For example, at least some of a plurality of second transistors T2 are arranged in a same layer. For another example, at least some of a plurality of second transistors T2 are arranged in a same layer as the first data lines 141. Second transistors T2 arranged in the same layer are synchronously formed by a patterning process.

In some examples, as shown in FIG. 4B, the light-transmitting region 11 is located in the middle of the display area 1. A first data line 141 includes a first portion 1411, and a second portion 1412 and a third portion 1413 located at two sides of the first portion 1411. The first portion 1411 is located in the first region 12, the second portion 1412 and the third portion 1413 are located in the second region 13, and the second portion 1412 is closer to a signal input terminal of the first data line 141 than the third portion 1413.

The display panel 100 includes one second transistor T2. The first portion 1411 and the second portion 1412 of the first data line 141 are electrically connected through the second transistor T2. That is, a first electrode of the second transistor T2 is electrically connected to the first portion 1411 of the first data line 141, and a second electrode of the second transistor T2 is electrically connected to the second portion 1412 of the first data line 141. A gate of the second transistor T2 is connected to a second control terminal through a second control signal line 21, so as to control a turn-on or turn-off of the second transistor T2.

For example, the second transistor T2 is disposed at a side of the first data line 141 proximate to the signal input terminal, for example, at a region in the last sub-pixel row in the display area 1.

Referring to FIGS. 3B, 4B, 5A, and 5B, an example in which the first transistor T1, the second transistor T2, and the transistors in the pixel driving circuit are all P-type transistors is considered.

Figure 5A:
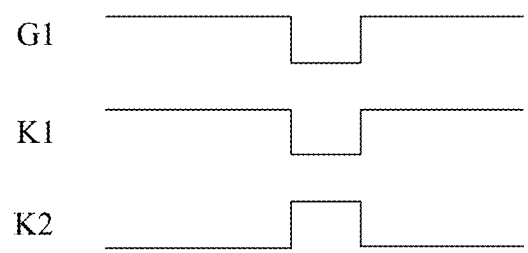
FIG. 5A is a signal timing diagram of a display panel, in accordance with some embodiments.

As shown in FIGS. 3B, 4B, and 5A, when the processor inputs a gate scan signal G1 to a pixel driving circuit electrically connected to any second light-emitting device A in the light-transmitting region 11, it also inputs a first control signal K1 to a first transistor T1. The first control signal K1 is a low-level signal, and the first transistor T1 is turned on, so that the first data line 141 and the second data line 142 are connected as a whole, and the second data signal from the data signal input terminal of the second data signal line 142 is transmitted to the pixel driving circuit electrically connected to the second light-emitting device A through the first data line 141. As a result, the pixel driving circuit drives the second light-emitting device A to emit light according to the second data signal. In this case, a second control signal K2 is a high-level signal, and the second transistor T2 is turned off, so that the first portion 1411 and the second portion 1412 of the first data line 141 are disconnected to prevent the first data signal from the signal input terminal of the first data line 141 from being transmitted to the pixel driving circuit electrically connected to the second light-emitting device A.

Figure 5B:
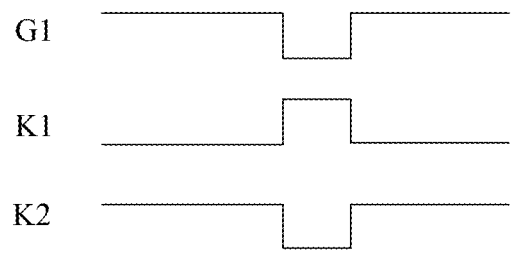
FIG. 5B is another signal timing diagram of a display panel, in accordance with some embodiments.

As shown in FIGS. 3B, 4C and 5B, when the processor inputs a gate scan signal G1 to any row of pixel driving circuits located in the second region 13, it inputs a first control signal K1 to the first transistors T1. The first control signal K1 is a high-level signal, and the first transistor T1 is turned off, so that the first data line 141 is not connected to the second data line 142. In this case, the second control signal K2 is a low-level signal, and the second transistor T2 is turned on, so that the first portion 1411 and the second portion 1412, of the first data line 141, are connected, and the first data signal from the signal input terminal of the first data line 141 is transmitted to a pixel driving circuit in the row through the first data line 141, as a result, a first light-emitting device in an effective sub-pixel P that is electrically connected to the pixel driving circuit and in the row emits light. The second data signal from the signal input terminal of the second data line 142 is transmitted to a pixel driving circuit in the row through the second data line 142, so that a first light-emitting device in another effective sub-pixel P that is electrically connected to the pixel driving circuit and in the row emits light.

In some other examples, as shown in FIG. 4C, the light-transmitting region 11 is located in the middle of the display area 1. The display panel includes two second transistors T2 (i.e., T21 and T22). The first portion 1411 and the second portion 1412 are electrically connected to a first electrode and a second electrode of a second transistor T21 respectively, and the first portion 1411 and the third portion 1413 are electrically connected to a first electrode and a second electrode of the other second transistor T22 respectively.

For example, the second transistor T22 is disposed at a side proximate to the signal input terminal of the first data line 141, for example, at the region in the last sub-pixel row in the display area 1. The second transistor T21 is disposed at a position in the second region 13 closest to a row of sub-pixels in the first region 12.

In this way, in the case where the first transistor T1 is turned on, the second transistor T22 that connects the first portion 1411 and the second portion 1412 is turned off to prevent the first data signal from the signal input terminal of the first data line 141 from being transmitted to the pixel driving circuit electrically connected to the second light-emitting device A. The second transistor T21 that connects the first portion 1411 and the third portion 1413 is turned off, so that the second data signal from the second data line 142 is transmitted to the first portion 1411 of the first data line 141 and is prevented from being transmitted to the third portion 1413 of the first data line 141.

An example in which the first transistor T1, the second transistor T2, and the transistors in the pixel driving circuit are all P-type transistors is considered.

Figure 6A:
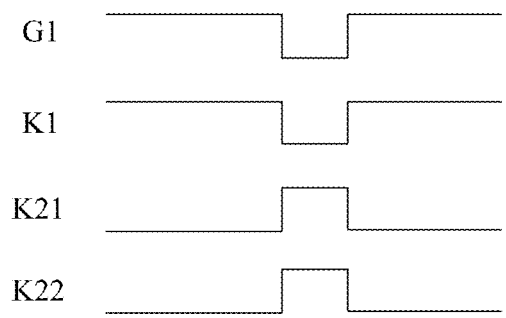
FIG. 6A is yet another schematic diagram of a display panel, in accordance with some embodiments.

As shown in FIGS. 3B, 4C, and 6A, when the processor inputs a gate scan signal G1 to a pixel driving circuit electrically connected to any second light-emitting device A in the light-transmitting region 11, it also inputs a first control signal K1 to a first transistor T1. The first control signal K1 is a low-level signal, and the first transistor T1 is turned on, so that the first data line 141 and the second data line 142 are connected as a whole, and the second data signal from the data signal input terminal of the second data signal line 142 is transmitted to the pixel driving circuit electrically connected to the second light-emitting device A through the first data line 141. As a result, the pixel driving circuit drives the second light-emitting device A to emit light according to the second data signal. In this case, second control signals K21 and K22 are each a high-level signal, and the second transistor T21 and the second transistor T22 are all turned off, so that the first portion 1411 and the second portion 1412 of the first data line 141 are disconnected to prevent the first data signal from the signal input terminal of the first data line 141 from being transmitted to the pixel driving circuit electrically connected to the second light-emitting device A.

Figure 6B:
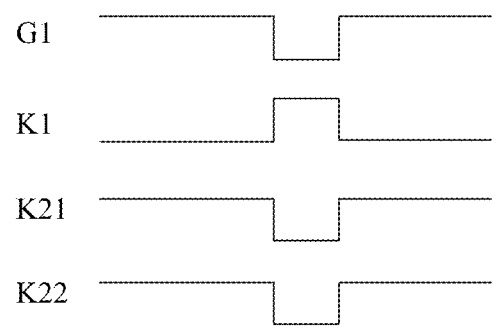
FIG. 6B is yet another schematic diagram of a display panel, in accordance with some embodiments.

As shown in FIGS. 3B, 4C and 6B, when the processor inputs the gate scan signal G1 to any row (e.g., the first row, the second row, the seventh row or the eighth row as shown in FIG. 3B) of pixel driving circuits located in the second region 12, it inputs the first control signal K1 to a first transistor T1. The first control signal K1 is a high-level signal, and the first transistor T1 is turned off, so that the first data line 141 is not connected to the second data line 142. In this case, the second control signal K21 and the second control signal K22 are each a low-level signal, and the second control signal K21 and the second control signal K22 are all turned on, so that the first portion 1411, the second portion 1412 and the third portion 1413, of the first data line 141, are connected, and the first data signal from the signal input terminal of the first data line 141 is transmitted to a pixel driving circuit in the row through the first data line 141, as a result, a first light-emitting device in an effective sub-pixel P that is electrically connected to the pixel driving circuit and in the row emits light. The second data signal from the signal input terminal of the second data line 142 is transmitted to a pixel driving circuit in the row through the second data line 142, so that a first light-emitting device in another effective sub-pixel P that is electrically connected to the pixel driving circuit and in the row emits light.

In some embodiments, the display panel further includes capacitors C. In order to distinguish from the first storage capacitor Cst in the above pixel driving circuits, the capacitors C hereinafter is referred to as second storage capacitors C2.

Figure 7:
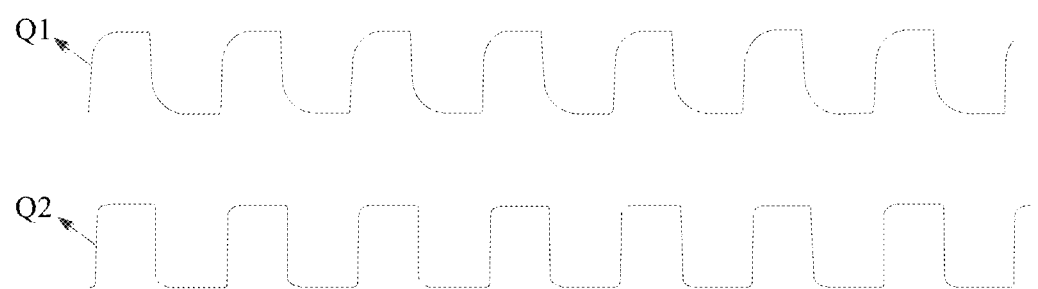
FIG. 7 is a simulation waveform diagram of a second data signal, in accordance with some embodiments.

As shown in FIG. 4, a first storage electrode of the second storage capacitor C2 is electrically connected to the first electrode of the first transistor T1, and a second storage electrode of the second storage capacitor C2 is electrically connected to the second electrode of the first transistor T1. In this way, the second data signal from the signal input terminal of the second data line 142 is transmitted to the second storage electrode of the second storage capacitor C2, so that a voltage of the second storage electrode of the second storage capacitor C2 is a voltage of the second data signal (denoted as V2), and a voltage of the first storage electrode of the second storage capacitor C2 is a voltage of the first data signal from the signal input terminal of the first data line 141 (denoted as V1). In this way, when the first transistor T1 is turned on, the voltage of the first storage electrode of the second storage capacitor C2 jumps from V1 to V2 according to a charge retention law of a capacitor, so that voltages of the first electrode and second electrode of the first transistor T1 are the same in a short time. As a result, a voltage drop is reduced, an influence of the first transistor T1 on a transmission of the second data signal (referring to FIG. 7) is reduced, and a uniformity of a brightness of the display panel is improved. FIG. 7 shows a signal simulation waveform diagram of the second data signal being transmitted from the second data line to the first data line, where Q1 is a signal simulation waveform of the second data signal being transmitted from the second data line to the first data line in a case where the second storage capacitor C2 is electrically connected between the first electrode and the second electrode of the first transistor T1, and Q2 is a signal simulation waveform of the second data signal being transmitted from the second data line to the first data line in a case where there is no second storage capacitor C2 electrically connected between the first electrode and the second electrode of the first transistor T1.

In some embodiments, in each row of second light-emitting devices A, any two adjacent second light-emitting devices A have a same distance therebetween. In a row of sub-pixels including dummy sub-pixel(s) D and effective sub-pixels P, a distance between any two adjacent effective sub-pixels P is equal to a distance between two adjacent second light-emitting devices A. In this way, display resolutions of the light-transmitting region 11 and the first region 12 are equal, so that the display effect of the display panel is improved.

In some examples, as shown in FIGS. 3A and 3B, in a row of sub-pixels including dummy sub-pixels D and effective sub-pixels P, three dummy sub-pixels D are arranged between any two adjacent effective sub-pixels P. Herein, since only effective sub-pixels P are provided in the second region 13, a resolution of the second region 13 is higher than the resolutions of the first region 12 and the light-transmitting region 11.

In some embodiments, as shown in FIGS. 3A and 3B, the display area 1 includes one first region 12, and the first region 12 is located at a side of the light-transmitting region 11 in a direction perpendicular to an extension direction of the data line.

Figure 8:
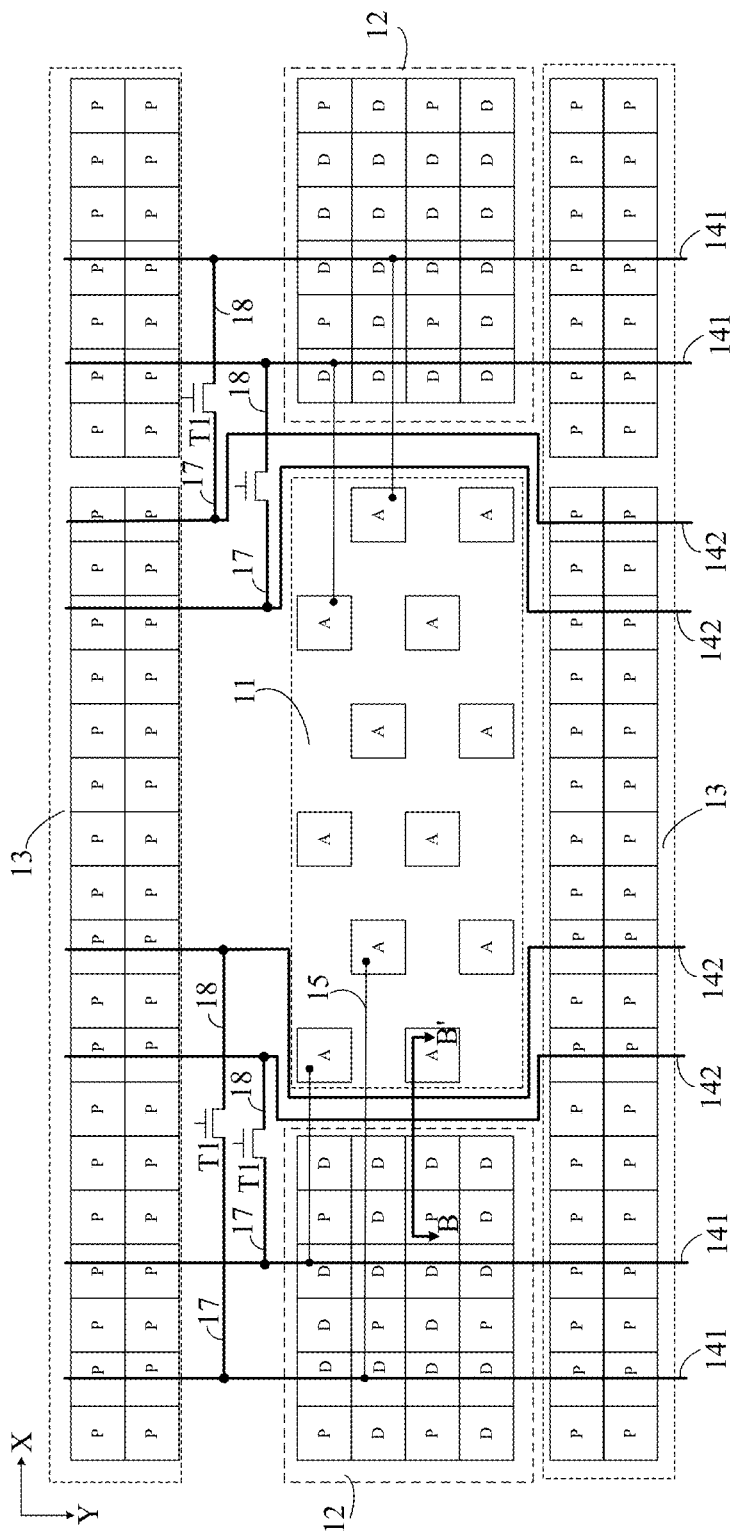
FIG. 8 is a schematic diagram of yet another display panel, in accordance with some embodiments.

In some embodiments, as shown in FIG. 8, the display area 1 includes two first regions 12, and the two first regions 12 are located at two sides of the light-transmitting region 11 in the direction perpendicular to the extension direction of the data line. The light-transmitting region 11 is located in the middle of the display area 1. In this way, the second light-emitting devices A in the light-transmitting region 11 may be electrically connected to respective dummy sub-pixels D in the first regions 12 located at the two sides of the light-transmitting region 11, so that wiring position of a plurality of auxiliary connection lines 15 and the plurality of data lines may be arranged uniformly in the display panel.

Figure 9:
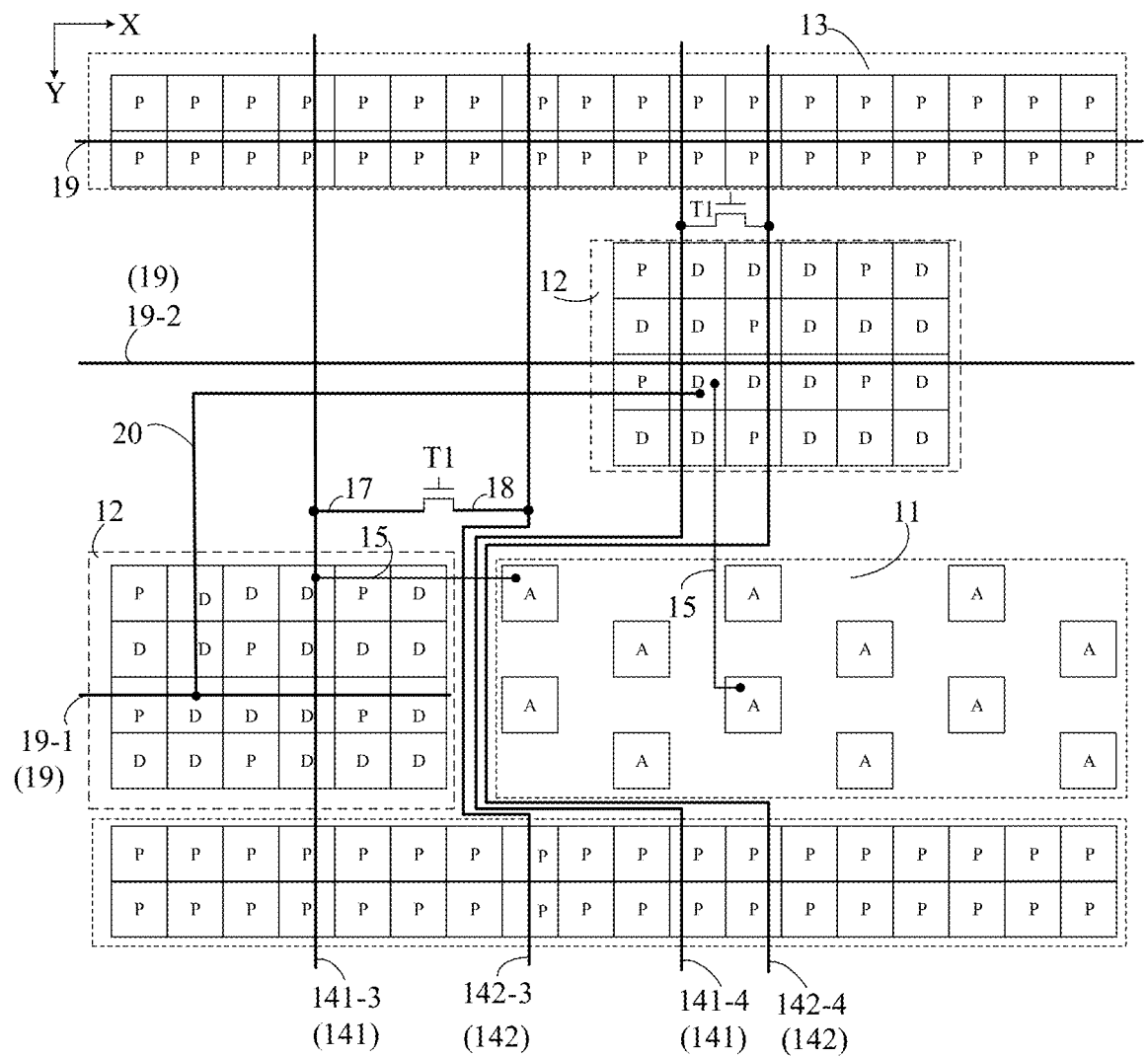
FIG. 9 is a schematic diagram of yet another display panel, in accordance with some embodiments.

In some embodiments, as shown in FIG. 9, the display area 1 includes two first regions 12, one first region 12 is located at a side of the light-transmitting region 11 in the direction perpendicular to the extension direction of the data line direction, and the other first region 12 is located at a side of the light-transmitting region 11 in a direction of the extension direction of the data line. The light-transmitting region 11 is located in the middle of the display area 1. A plurality of sub-pixels shown in FIG. 9 are arranged in twelve rows and eighteen columns, that is, there are a first column to an eighteenth column in the X direction, and a first row to a twelfth row in the Y direction.

In some examples, as shown in FIG. 9, the display panel 100 further includes a plurality of gate lines 19 and a plurality of scan signal connection lines 20. At least effective sub-pixels P in a row of sub-pixels are electrically connected to a gate line. For example, as shown in FIG. 9, a gate line 19-1 is electrically connected to sub-pixels in a ninth row of sub-pixels, and the row of sub-pixels includes effective sub-pixels P and dummy sub-pixels D. For another example, as shown in FIG. 9, a gate line 19-2 is electrically connected to sub-pixels in a second row of sub-pixels, and the row of sub-pixels includes only effective sub-pixels P.

An end of each scan signal connection line 20 is electrically connected to a gate line 19 electrically connected to effective sub-pixels P in a same row as a second light-emitting device A, the other end of the scan signal connection line 20 is electrically connected to a pixel driving circuit of a dummy sub-pixel D electrically connected to the second light-emitting device A and the pixel driving circuit of the dummy sub-pixel D is insulated from a gate line 20 electrically connected to effective sub-pixels P in a same row as the dummy sub-pixel D.

For example, as shown in FIG. 9, a first data line 141-3 is electrically connected to pixel driving circuits in sub-pixels in a fourth column, and second light-emitting devices A in a first column are located in a same column as sub-pixels in an eighth column. A second data line 142-3 is electrically connected to pixel driving circuits in the sub-pixels in the eighth column. A second light-emitting device A, in the first column and in a first row, in the light-transmitting region 11 is electrically connected to a pixel driving circuit in a dummy sub-pixel D in a same row through an auxiliary connection line 15. The first data line 141-3 is electrically connected to the second data line 142-3 through a first transistor T1.

In this way, in the case where the first transistor T1 is turned on, the first data line 141-3 and the second data line 142-3 are connected as a whole, and a second data signal from a signal input terminal of the second data line 142-3 is transmitted to the pixel driving circuit in the dummy sub-pixel D electrically connected to the second light-emitting device A through the first data line 141-3, so that the second light-emitting device A emits light.

In the case where the first transistor T1 is turned off, the first data line 141-3 is disconnected to the second data line 142-3, and a first data signal from a signal input terminal of the first data line 141-3 is transmitted to the pixel driving circuits electrically connected to the first data line 141-3, so that a column of effective sub-pixels P electrically connected to the first data line 141-3 may display an image normally.

For another example, as shown in FIG. 9, second light-emitting devices A in a third column in the light-transmitting region 11 are located in a same column as sub-pixels in a twelfth column, and a second data line 142-4 is electrically connected to pixel driving circuits in the sub-pixels in the twelfth column. A first data line 141-4 is electrically connected to pixel driving circuits in sub-pixels in an eleventh column. A second light-emitting device A, in a third column and in a third row, in the light-transmitting region 11 is electrically connected to is electrically connected to a pixel driving circuit in a dummy sub-pixel D in a same column through an auxiliary connection line 15. The first data line 141-4 is electrically connected to the second data line 142-4 through a first transistor T1. An end of a scan signal connection line 20 is electrically connected to a gate line 19-1 electrically connected to effective sub-pixels P in a same row (i.e., a ninth row) as the second light-emitting device A, and the other end of the scan signal connection line 20 is electrically connected to the pixel driving circuit in the dummy sub-pixel D electrically connected to the second light-emitting device A, and the pixel driving circuit in the dummy sub-pixel D is insulated from a gate line 19-2 electrically connected to effective sub-pixels P in a same line (i.e., a fifth row) as the dummy sub-pixel D.

In this way, in the case where the first transistor T1 is turned on, the first data line 141-4 and the second data line 142-4 are connected as a whole, a second data signal from a signal input terminal of the second data line 142-4 is transmitted to the pixel driving circuit in the dummy sub-pixel D electrically connected to the second light-emitting device A through the first data line 141-4, and a gate scan signal from the gate line 19-1 is transmitted to the pixel driving circuit in the dummy sub-pixel D electrically connected to the second light-emitting device A through the scan signal connection line 20, so that the second light-emitting device A emits light normally.

In the case where the first transistor T1 is turned off, the first data line 141-4 is disconnected to the second data line 142-4, and a first data signal from a signal input terminal of the first data line 141-4 is transmitted to the pixel driving circuits electrically connected to the first data line 141-4, so that a column of effective sub-pixels P electrically connected to the first data line 141-4 may display an image normally. The second data signal from the signal input terminal of the second data line 142-4 is transmitted the pixel driving circuits electrically connected to the second data line 142-4, so that a column of effective sub-pixels P electrically connected to the second data line 142-4 may display normally.

In addition, as shown in FIG. 9, the first region 12 is provided at the side of the light-transmitting region 11 in the extension direction of the data line, so that the number of the dummy sub-pixels D is increased, and the number of the second light-emitting to devices A in the light-transmitting region is accordingly increased, as a result, an area of the light-transmitting region 11 is increased.

Some embodiments of the present disclosure provide a control method of a display panel. The method includes S100 to S300.

In S100, a processor inputs gate scan signals to a plurality of rows of sub-pixels row by row.

In S200, when the processor inputs a gate scan signal to a pixel driving circuit electrically connected to any second light-emitting device A in the light-transmitting region 11, the processor further inputs a control signal to a first transistor T1 to turn on the first transistor T1.

In S300, the processor inputs data signals to each row of sub-pixels through a plurality of data lines 14; when the first transistor T1 is turned on, a second data signal from a signal input terminal of the second data line 142 is transmitted to the pixel driving circuit electrically connected to the second light-emitting device A through the first data line 141.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area, the display area including a light-transmitting region, at least one first region and a second region, the at least one first region being located at least at a side of the light-transmitting region; the display panel comprising:
    a plurality of sub-pixels disposed in the at least one first region and the second region, the plurality of sub-pixels being arranged in a plurality of rows and a plurality of columns, each sub-pixel including a pixel driving circuit, the plurality of sub-pixels including a plurality of effective sub-pixels and a plurality of dummy sub-pixels, the plurality of dummy sub-pixels being disposed in the at least one first region; each effective sub-pixel further including a first light-emitting device electrically connected to a pixel driving circuit;
    a plurality of second light-emitting devices disposed in the light-transmitting region, the plurality of second light-emitting devices being arranged in a plurality of columns, each column of second light-emitting devices and a column of sub-pixels are arranged in a column;
    a plurality of data lines, the plurality of data lines including first data lines and second data lines; wherein a first data line is electrically connected to pixel driving circuits in a column of sub-pixels including at least one dummy sub-pixel, a second data line is electrically connected to pixel driving circuits in a column of sub-pixels located in a same column as a column of second light-emitting devices, and a second light-emitting device in the column of second light-emitting devices is electrically connected to a pixel driving circuit in a dummy sub-pixel connected to the first data line; and
    first transistors, the first data line being electrically connected to the second data line through a first transistor.

2. The display panel according to claim 1, wherein in the column of sub-pixels electrically connected to the first data line, sub-pixels located in the at least one first region are all dummy sub-pixels.

3. The display panel according to claim 1, wherein of the plurality of effective sub-pixels, effective sub-pixels located in the at least one first region are uniformly arranged.

4. The display panel according to claim 1, further comprising:
    at least one first connection line, the at least one first connection line being disposed at a side of the at least one first region away from a signal input terminal of the first data line, an end of the at least one first connection line being electrically connected to a first electrode of respective at least one first transistor of the first transistors, and another end of the at least one first connection line being electrically connected to respective at least one first data line of the first data lines; and/or
    at least one second connection line, the at least one second connection line being disposed at the side of the at least one first region away from the signal input terminal of the first data line, an end of the at least one second connection line being electrically connected to a second electrode of respective at least one first transistor of the first transistors, and another end of the at least one second connection line being electrically connected to respective at least one second data line of the second data lines.

5. The display panel according to claim 1, further comprising:
    one or more second transistors, at least one second transistor being configured to connect a portion of the first data line located in a first region to a portion of the first data line located in the second region when the at least one second transistor is turned on, and to disconnect the portion of the first data line located in the first region from the portion of the first data line located in the second region when the at least one second transistor is turned off; wherein the portion of the first data line located in the first region is electrically connected to the second data line.

6. The display panel according to claim 5, wherein the light-transmitting region is located in a middle of the display area;
the portion of the first data line located in the first region serves as a first portion, and the portion of the first data line located in the second region includes a second portion and a third portion that are located at two sides of the first portion, and the second portion is closer to a signal input terminal of the first data line than the third portion; and
the at least one second transistor includes one second transistor, the first portion and the second portion are electrically connected to a first electrode and a second electrode of the second transistor respectively; or the at least one second transistor includes two second transistors, the first portion and the second portion are electrically connected to a first electrode and a second electrode of one second transistor of the second transistors respectively, and the first portion and the third portion are electrically connected to a first electrode and a second electrode of another second transistor respectively.

7. The display panel according to claim 1, further comprising:
capacitors, a first storage electrode of a capacitor is electrically connected to a first electrode of the first transistor, and a second storage electrode of the capacitor is electrically connected to a second electrode of the first transistor.

8. The display panel according to claim 1, wherein in each row of second light-emitting devices, any two adjacent second light-emitting devices have a same distance therebetween; and
in a row of sub-pixels including at least one dummy sub-pixel and effective sub-pixels, a distance between any two adjacent effective sub-pixels is equal to the distance between the two adjacent second light-emitting devices.

9. The display panel according to claim 8, wherein in the row of the sub-pixels including the at least one dummy sub-pixel and the effective sub-pixels, any two adjacent effective sub-pixels are provided with three dummy sub-pixels therebetween.

10. The display panel according to claim 1, wherein the at least one first region includes one first region located at a side of the light-transmitting region in a direction perpendicular to an extension direction of the data lines.

11. The display panel according to claim 1, wherein the at least one first region includes two first regions located at two sides of the light-transmitting region in a direction perpendicular to an extension direction of the data lines.

12. The display panel according to claim 1, wherein the at least one first region includes two first regions, one first region is located at a side of the light-transmitting region in a direction perpendicular to an extension direction of the data lines, and another first region is located at a side of the light-transmitting region in the extension direction of the data lines.

13. The display panel according to claim 12, further comprising:
a plurality of gate lines, at least effective sub-pixels in a row of sub-pixels being electrically connected to a gate line; and
a plurality of scan signal connection lines, wherein an end of a scan signal connection line is electrically connected to a gate line electrically connected to effective sub-pixels in a same row as a second light-emitting device, another end of the scan signal connection line is electrically connected to a pixel driving circuit, electrically connected to the second light-emitting device, of a dummy sub-pixel, and the pixel driving circuit of the dummy sub-pixel is insulated from a gate line electrically connected to effective sub-pixels in the same row as the dummy sub-pixel.

14. The display panel according to claim 1, wherein the first light-emitting device and the plurality of second light-emitting devices are each an organic light-emitting diode (OLED).

15. A display apparatus, comprising:
the display panel according to claim 1; and
an image sensor located in the light-transmitting region.

16. A control method of a display panel, the display panel according to claim 1, the method comprising:
inputting gate scan signals to a plurality of rows of sub-pixels row by row;
when a gate scan signal is input to a pixel driving circuit electrically connected to any second light-emitting device in the light-transmitting region, inputting a control signal to the first transistor to turn on the first transistor;
inputting data signals to each row of sub-pixels through the plurality of data lines; and
transmitting a second data signal from a signal input terminal of the second data line to the pixel driving circuit, electrically connected to the second light-emitting device, through the first data line.

17. The display panel according to claim 1, wherein each second data line has a first winding portion, and the first winding portion detours around the light-transmitting region.

18. The display panel according to claim 1, wherein the plurality of data lines further includes at least one third data line, and a third data line of the at least one third data line is only electrically connected to pixel driving circuits in a column of sub-pixels in which all sub-pixels are effective sub-pixels and is located in a different column from any column of second light-emitting devices.

19. The display panel according to claim 18, wherein the effective sub-pixels electrically connected to the third data line are located at a side of the light-transmitting region in an extension direction of the data lines, the third data line has a second winding portion, and the second winding portion detours around the light-transmitting region.

20. The display panel according to claim 1, wherein the second light-emitting device is located in a same row as the dummy sub-pixel in which the pixel driving circuit is electrically connected to the second light-emitting device.

* * * * *